(12) United States Patent
Godet et al.

(10) Patent No.: US 11,733,533 B2
(45) Date of Patent: *Aug. 22, 2023

(54) FABRICATION OF DIFFRACTION GRATINGS

(71) Applicant: Applied Materials, Inc., Santa Clara, CA (US)

(72) Inventors: Ludovic Godet, Sunnyvale, CA (US); Wayne Mcmillan, San Jose, CA (US); Rutger Meyer Timmerman Thijssen, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/745,457

(22) Filed: May 16, 2022

(65) Prior Publication Data

US 2022/0276498 A1    Sep. 1, 2022

Related U.S. Application Data

(63) Continuation of application No. 16/454,642, filed on Jun. 27, 2019, now Pat. No. 11,333,896.

(Continued)

(51) Int. Cl.
*G02B 27/09* (2006.01)
*G02B 5/18* (2006.01)
(Continued)

(52) U.S. Cl.
CPC .......... *G02B 27/0944* (2013.01); *G02B 5/18* (2013.01); *G02B 5/1857* (2013.01); *G03F 1/80* (2013.01); *G03F 7/0002* (2013.01)

(58) Field of Classification Search
CPC .... G02B 27/0944; G02B 5/18; G02B 5/1857; G02B 6/124; G02B 6/136; G03F 1/80;
(Continued)

(56) References Cited

U.S. PATENT DOCUMENTS 10,302,826 B1    5/2019   Meyer Timmerman Thijssen et al.
10,845,596 B2   11/2020   Lee et al.
(Continued)

FOREIGN PATENT DOCUMENTS

EP    3717967 A1    10/2020
JP    H10096807 A    4/1998
(Continued)

OTHER PUBLICATIONS

PCT Notification of Transmittal of the International Search Report and the Written Opinion of the International Searching Authority for International Application No. PCT/US2019/039615; dated Oct. 18, 2019; 11 total pages.

(Continued)

*Primary Examiner* — Duy Vu N Deo
(74) *Attorney, Agent, or Firm* — Patterson + Sheridan, LLP

(57) ABSTRACT

The systems and methods discussed herein are for the fabrication of diffraction gratings, such as those gratings used in waveguide combiners. The waveguide combiners discussed herein are fabricated using nanoimprint lithography (NIL) of high-index and low-index materials in combination with and directional etching high-index and low-index materials. The waveguide combiners can be additionally or alternatively formed by the directional etching of transparent substrates. The waveguide combiners that include diffraction gratings discussed herein can be formed directly on permanent transparent substrates. In other examples, the diffraction gratings can be formed on temporary substrates and transferred to a permanent, transparent substrate.

20 Claims, 12 Drawing Sheets

Related U.S. Application Data

(60) Provisional application No. 62/692,286, filed on Jun. 29, 2018, provisional application No. 62/691,421, filed on Jun. 28, 2018.

(51) Int. Cl.
  *G03F 1/80* (2012.01)
  *G03F 7/00* (2006.01)

(58) Field of Classification Search
  CPC .............. G03F 7/0002; G03F 7/2022; H01L 21/02266; H01L 21/0228; H01L 21/0337; H01L 21/306
  USPC .......................................................... 216/24
  See application file for complete search history.

(56) References Cited

U.S. PATENT DOCUMENTS

| | | | |
|---|---|---|---|
| 11,333,896 B2* | 5/2022 | Godet | ................. G02B 5/1857 |
| 2004/0013076 A1 | 1/2004 | Funato et al. | |
| 2004/0018712 A1* | 1/2004 | Plas | ..................... H01L 23/481 |
| | | | 257/E21.597 |
| 2010/0265571 A1 | 10/2010 | Wang et al. | |
| 2010/0277803 A1* | 11/2010 | Pockett | ................. G03B 21/62 |
| | | | 353/121 |
| 2011/0279818 A1 | 11/2011 | Amako et al. | |
| 2012/0257490 A1 | 10/2012 | Zhou | |
| 2013/0267095 A1 | 10/2013 | Heo et al. | |
| 2015/0125976 A1 | 5/2015 | Wang | |
| 2016/0035539 A1 | 2/2016 | Sainiemi et al. | |
| 2016/0308020 A1 | 10/2016 | Sreenivasan et al. | |
| 2017/0343708 A1 | 11/2017 | Niwa et al. | |
| 2018/0052501 A1 | 2/2018 | Jones, Jr. et al. | |

FOREIGN PATENT DOCUMENTS

| | | |
|---|---|---|
| JP | 2000075117 A | 3/2000 |
| JP | 2005004068 A | 1/2005 |
| JP | 2007-316270 A | 12/2007 |
| JP | 2009516225 A | 4/2009 |

OTHER PUBLICATIONS

Lan Ilongbo et al: "Nanoimprint Lithography" In: "Lithography", Feb. 1, 2010 (Feb. 1, 2010), InTech,xP055890501, ISBN: 978-953-30-7064-3, DoI: LO.5772/8L89, http://dx.doi.org/10.5772/8189, 4 pages.

European Patent Application No. 19824762.9, Extended European Search Report, dated Feb. 22, 2022, 10 pages.

Japanese Office Action dated Mar. 22, 2022 for Application No. 2020-571759.

* cited by examiner

FABRICATION OF DIFFRACTION GRATINGS

CROSS-REFERENCE TO RELATED APPLICATIONS

This application is a continuation of U.S. application Ser. No. 16/454,642, filed Jun. 27, 2019, which claims priority to U.S. Provisional App. No. 62/691,421, "Fabrication of Diffraction Gratings," filed Jun. 28, 2018, incorporated herein in its entirety by reference, and U.S. Provisional App. No. 62/692,286, "Fabrication of Diffraction Gratings," filed Jun. 29, 2018. Each of which is incorporated by reference herein in their entirety.

BACKGROUND

Field

The embodiments of the disclosure generally relate to optical element structures and systems and methods of fabricating optical element structures such as those used in various types of waveguides.

Description of the Related Art

Waveguides are structures that guide electromagnetic or sound waves by enabling a signal to propagate with a minimal loss of energy by restricting the expansion of the signal one dimension or two dimensions. Waves propagate in three dimensions, and the wave can lose power as it propagates away from the source that generated the wave, such as a sound wave or an electromagnetic wave. By confining the waves such that they propagate in one or two dimensions, the power of the wave is conserved. The waveguide thus preserves the power of the wave while it propagates.

Waveguide combiners are used to combine signals such as RF signals by accepting multiple input signals and producing a single output signal that is a combination of the input signals. As demand for waveguides increases, for example, in optical fiber applications, radar applications, scientific instrumentation, and augmented reality, a demand for waveguides increases, and current technologies involve making master patterns and doing imprint replication to form a grating, so only materials that are imprint-able can be used for waveguide fabrication.

Thus, there remains a need for systems and methods of improved waveguide manufacturing.

SUMMARY

Systems and methods discussed herein are directed towards methods of forming gratings. In one example, a method of pattering a substrate includes forming a hardmask layer on a first side of a substrate, wherein the substrate is formed from a transparent material and is defined by a normal plane along a width of the substrate; and forming, by nanoimprint lithography, on the hardmask layer, a patterned layer. In the example, the method further includes etching the patterned layer and the hardmask layer to expose the first side of the substrate; removing the patterned layer; and etching the first side of the substrate to form a first plurality of angled mesas in the first side of the substrate. Each angled mesa of the first plurality of angled mesas is etched at an angle from 20 degrees to 70 degrees relative to the normal plane. Further in the method, subsequent to etching the first side of the substrate, removing the hardmask layer.

In another examples, a method of forming a grating includes: forming a hardmask layer on a target stack, wherein the target stack is formed on a first side of a first substrate; etching a plurality of openings in the hardmask layer; and etching the target stack to form a first plurality of angled mesas in the target stack on the first side of the first substrate. Each angled mesa of the first plurality of angled mesas is etched at a first angle from 20 degrees to 70 degrees relative to a normal plane.

In another example, a method of forming a grating includes: forming a hardmask layer on a target stack, wherein the target stack is formed on a first side of a first substrate; etching a plurality of openings in the hardmask layer; and etching the target stack to form a first plurality of angled mesas in the target stack on the first side of the first substrate. Each angled mesa of the plurality of angled mesas is etched at an angle 20 degrees to 70 degrees relative to a normal plane. The method further includes forming a hardmask layer on a second side of the first substrate, wherein the first substrate is defined by a normal plane along a width of the substrate; and forming, by nanoimprint lithography, a patterned layer on the hardmask layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
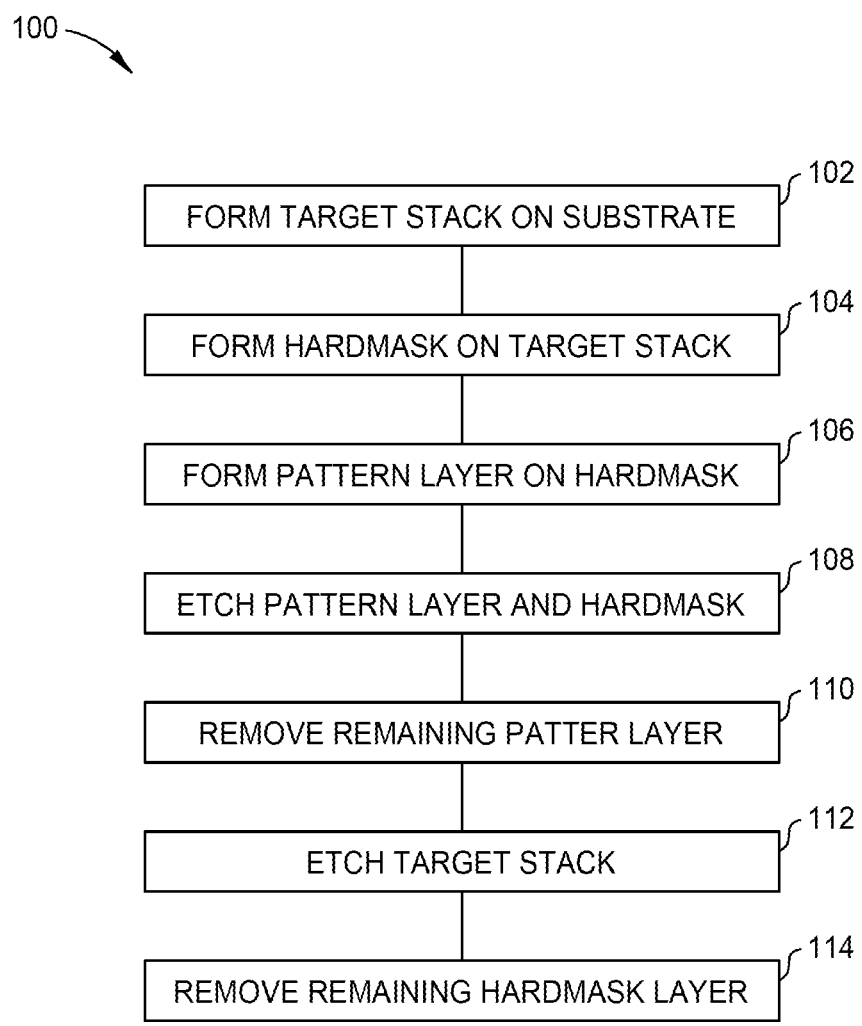
FIG. 1 is a flow chart of a method of forming a grating structure directly on a transparent substrate according to embodiments of the present disclosure.

The systems and methods discussed herein can include the mass production of diffraction gratings used for waveguides. Augmented reality surface relief waveguide combiners are made by a process of mastering and replication. Currently, these waveguide combiners have only been produced in quantities of thousands, whereas future projected volumes are in the tens of millions or greater. Challenges in the current manufacturing process include the reproducibility of the shapes replicated, especially as in high volume production, include concerns regarding the yield in the nanoimprint lithography (NIL) process. Further challenges include the release after the NIL imprinting of high angle gratings since the gratings can be formed at an angle of 45 degrees or greater with respect to the normal plane.

As discussed herein, materials with a low refractive index, "low-index" materials, can include silicon dioxide ($SiO_2$), doped $SiO_2$, fluorinated polymers, or porous materials. Materials with a high refractive index, "high-index" materials, can include amorphous and crystalline Si, silicon nitride (SiN), titanium dioxide ($TiO_2$), gallium phosphate (GaP), tantalum pentoxide ($Ta_2O_5$), or sulfur-inated materials and polymers.

Discussed herein are systems and methods for fabricating waveguide devices using direct etching and NIL. Waveguide devices including waveguide combiners include a plurality of diffraction gratings formed in a low-index material, a high-index material, or a combination of low and high-index materials, and a plurality of gratings formed in an optically transparent substrate such as polymer or glass. As discussed herein, a "transparent" substrate is a substrate that is optically transparent in a predetermined wavelength range within which the waveguide combiner is intended to operate. As discussed herein, a diffraction grating can be referred to as a "grating" or "gratings" and can include a plurality of angled mesas, which can also be referred to as teeth or fins, and a plurality of troughs formed in between adjacent angled mesas. In some examples, the troughs of a grating do not contain fill material, and in other examples, the troughs of a grating are filled with various materials. In one example, the mesas of a grating can be formed from a low-index material, and the troughs of the grating are filled with a high-index material. In another example, the angled mesas of a grating can be formed from a high-index material, and the troughs of the grating are filled with a low-index material. The angled mesas and troughs within a grating can be uniform in one or more of width, length, spacing, or angle with respect to a normal plane of the substrate. In another example, the angled mesas and troughs of a grating can differ in one or more of width, length, spacing, or angle with respect to a normal plane of the substrate.

As discussed in various embodiments herein, NIL can be used along with direct etching to fabricate a waveguide combiner. In some examples, a double-sided processing method is used to fabricate a waveguide combiner. The double-sided fabrication method includes forming a first grating in a target stack formed of at least one of a low or a high-index material by using NIL on a transparent substrate, and forming a second grating using direct etching on the other side of the same substrate. One of the challenges in a direct etch is performing lithography on glass substrates. For example, a conventional lithography process can be configured to accept a substrate with a maximum thickness of 775 µm due to lithography scanner parameters. Waveguide combiners are currently made using a glass substrate, with a thickness depending on the design, but are typically 0.5 mm or 0.8 mm thick, which is significantly thinner than what the lithography scanner is configured to process.

In one embodiment, a grating is formed using NIL and direct etching on a temporary substrate that can be formed from silicon. The grating is then de-bonded from the temporary substrate and transferred to a second, transparent substrate that can include glass. In another embodiment, the grating is formed via NIL and direct etching on a target layer already disposed on a glass or other transparent substrate. A grating can also be formed using NIL and direct etching in the transparent substrate. High angle gratings are formed using the systems and methods discussed herein, the angles may range from 20 degrees to 70 degrees from a normal plane parallel to the substrate. The waveguides and waveguide components discussed herein are formed by direct etching of the devices, and can be fabricated using temporary or permanent binding, in combination with NIL.

In other examples, waveguide designs with a wide range of duty cycles (DC) (i.e. the radio of the mesa width to the mesa pitch) are desirable. It can be challenging to fabricate this range of duty cycles with NIL due to imprint material shrinkage. However, in some embodiments, this challenge is overcome by imprinting a low index & low duty cycle grating, then filling the low duty cycle grating with a high index material to form a grating with a high duty cycle and a high index grating.

FIG. 1 is a flow chart of a method 100 of forming a grating structure directly on a transparent substrate. FIGS. 2A-2F are partial schematic illustrations of operations of the method 100. FIGS. 1 and 2A-2F are referenced together below.

Figure 2A:
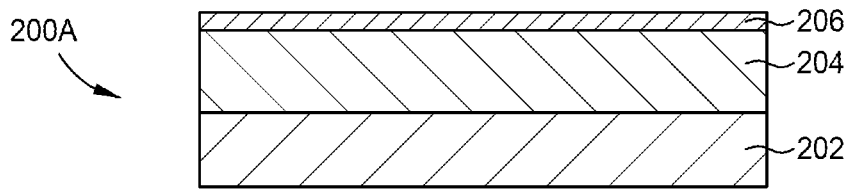
FIGS. 2A-2F are partial schematic illustrations of operations of the formation of a grating structure according to embodiments of the present disclosure.

At operation 102 of the method 100, and as shown in a structure 200A in FIG. 2A, a target stack 204 is formed on a substrate 202. The substrate 202 can be formed from a transparent substrate such as a glass or a polymer substrate which can be from 0.5 mm to 0.8 mm. At operation 104, a hardmask layer 206 is formed over the target stack 204 as shown in FIG. 2A. The target stack 204 can be fabricated of SiN, $TiO_2$, GaP, or another high-index material, and is deposited by CVD, PVD, spinning-on, or another appropriate method at operation 102. In one embodiment, a thickness of the target stack 204 can be from 100 nm to 500 nm, depending on the index and optical wavelength to be used in the finished waveguide combiner device. The hardmask layer 206 can be fabricated from TiN, TaN, Cr, or another etch-resistant material deposited by CVD, PVD, ALD or another thin-film deposition process at operation 104. The hardmask layer 206 can be formed at operation 104 to a thickness from about 10 nm to about 50 nm. In some examples, a hardmask layer 206 of less than 25 nm thick can be employed to reduce or avoid shadowing during subsequent etching operations.

Figure 2B:
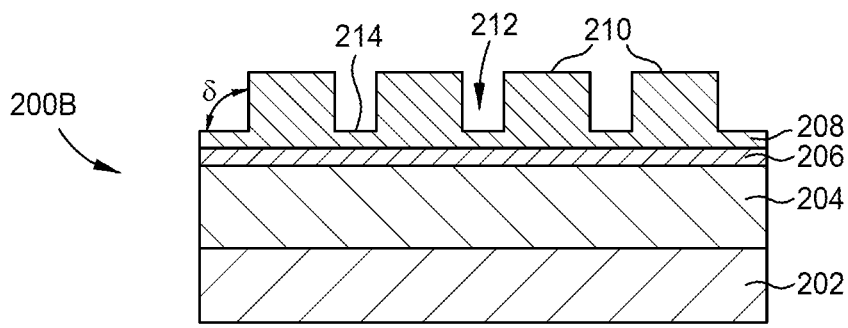

At operation 106 of the method 100, and as shown in a structure 200B in FIG. 2B, a pattern layer 208 is formed on the hardmask layer 206 using NIL. The pattern layer 208 is formed of an imprintable resist material. The pattern layer is formed of a plurality of raised features 210, A plurality of gaps 212 are formed between adjacent pairs of raised features 210. Each gap of the plurality of gaps 212 has a bottom residual layer 214 of the pattern layer 208. In an embodiment at operation 106, the NIL of the hardmask is performed with an angle δ between each of the raised features 210 and the substrate 202. The angle δ can be greater than 90 degrees, which can decrease cost and promote the formation of subsequent features during directional etching as discussed herein.

Figure 2C:
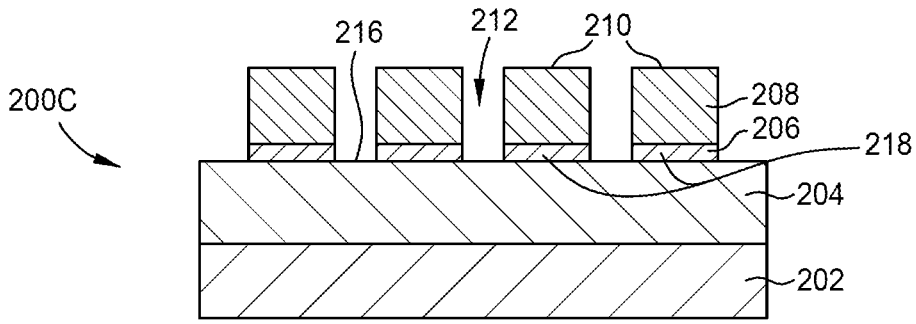
Figure 2D:
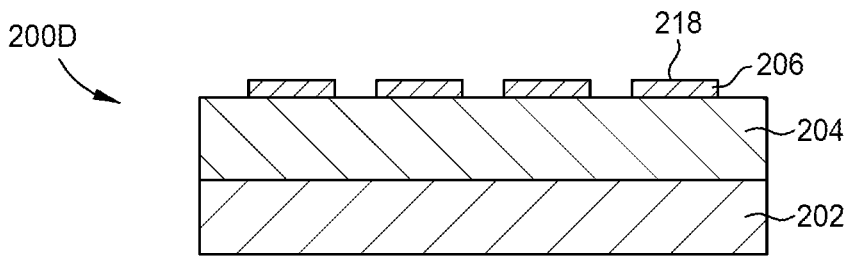
Figure 2E:
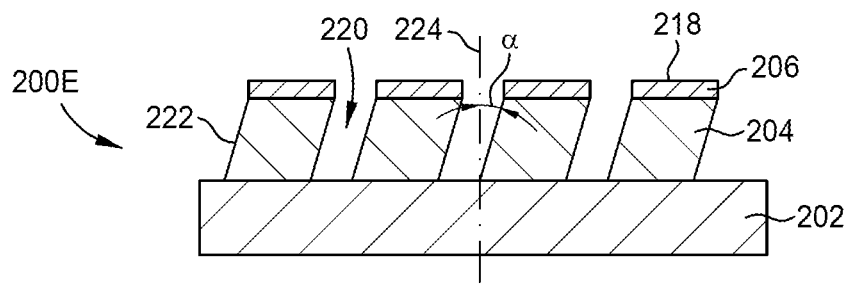

Subsequently, at operation 108, and as shown in a structure 200C in FIG. 2C, a portion of the hardmask layer 206 and the pattern layer 208 is removed via etching. As such, a bottom 216 of each gap 212 exposes the target stack 204 and a plurality of hardmask mesas 218 is formed. At operation 110 of the method 100, as shown in a structure 200D in FIG. 2D, the pattern layer 208 is removed, exposing the plurality of hardmask mesas 218. At operation 112, as shown in a structure 200E in FIG. 2E, the target stack 204 is etched to form a plurality of angled mesas 222 and a plurality of troughs 220 in between the angled mesas 222, the etching at operation 112 exposes the substrate 202. The plurality of angled mesas 222 can be formed at an angle α from the normal plane 224 of the substrate 202. The etching at operation 112 can be referred to as directional etching. The angle α can be from 20 degrees to 70 degrees.

Figure 2F:
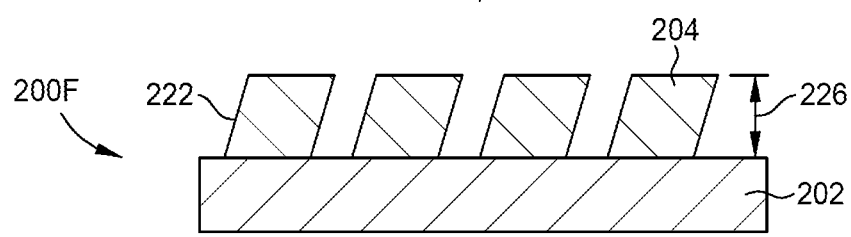

At operation 114, as shown in a structure 200F in FIG. 2F, the remaining portion of the hardmask layer 206 is removed, leaving the plurality of angled mesas 222 and the plurality of troughs 220 formed to a depth of 226. The directional etching discussed herein is performed, in one example, by positioning a first portion of the substrate 202 that is retained on a platen in a first position in a path of an ion beam in an etching chamber. The ion beam can be a ribbon beam, a spot beam, or a full, substrate-size beam that extends across a substrate from a first edge to a second edge that is parallel to the first edge. The ion beam is configured to contact a top surface of a target material, such as the target stack 204, to form a first grating that includes the angled mesas 222. The ion beam angle can be from 0 to 90 (i.e. any angle desired), but the ion beam is typically set at the desired etch angle (e.g. 20 to 70 degrees) relative to the normal plane of the substrate 202, such that the ion beam attacks the target stack 204 at the maximum angle desired. To obtain etches with lower angles than the maximum angle set by the ion beam direction the substrate 202 retained on the platen can be rotated about an axis of the platen to a predetermined rotation angle. The rotation results in the ion beam contacting the top surface of the target stack 204 at a different angle to form a second or other subsequent gratings. The amount of substrate rotation, e.g., the predetermined rotation angle used can be calculated to produce the exact grating etch angle desired.

In an alternate embodiment, the directional etching at operation 112 can be controlled (e.g., control of the etch depth, etch angle, and etch rate) by adjusting a hardmask thickness across the various gratings discussed herein. The hardmask thickness adjustment can be achieved by etching of the hardmask and/or by NIL, in some examples, NIL can be more cost-effective. In this example, when the directional etching at operation 112 is performed, the final depth of the plurality of troughs 220, as shown by 226 in FIG. 2F, can vary depending on the thickness of the hardmask layer 206 (formed by NIL at operation 106) at different locations on the grating.

Figure 3:
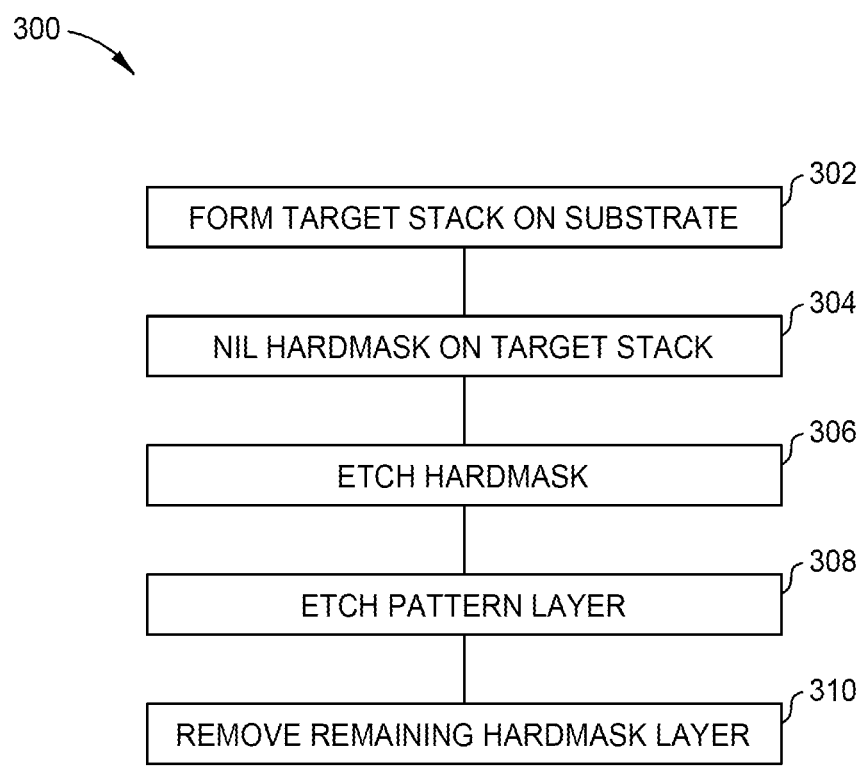
FIG. 3 is a flow chart of a method of forming a grating structure directly on a transparent substrate according to embodiments of the present disclosure.

FIG. 3 is a flow chart of a method 300 of forming a grating structure directly on a transparent substrate. FIGS. 4A-4E are partial schematic illustrations of the method 300. FIGS. 3 and 4A-4E are discussed together below.

Figure 4A:
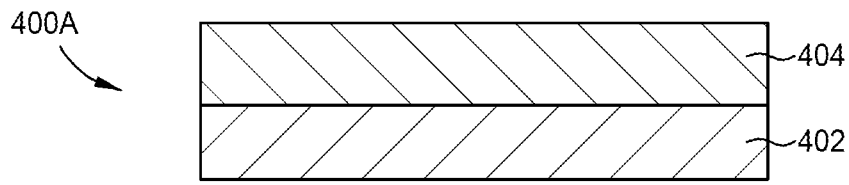
FIGS. 4A-4E are partial schematic illustrations of the formation of a grating structure according to embodiments of the present disclosure.
Figure 4B:
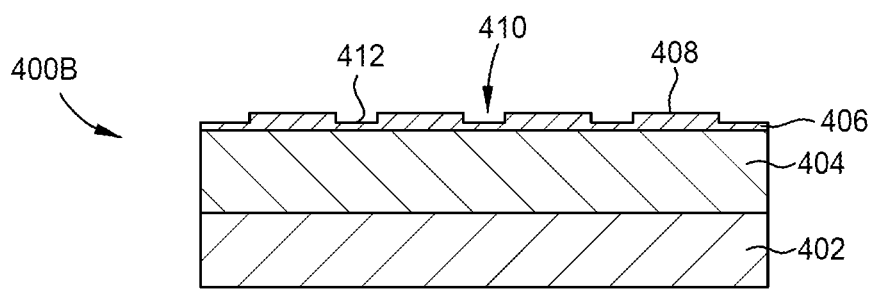
Figure 4C:
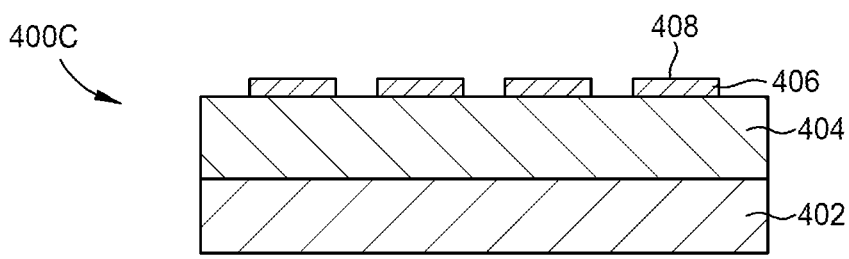
Figure 4D:
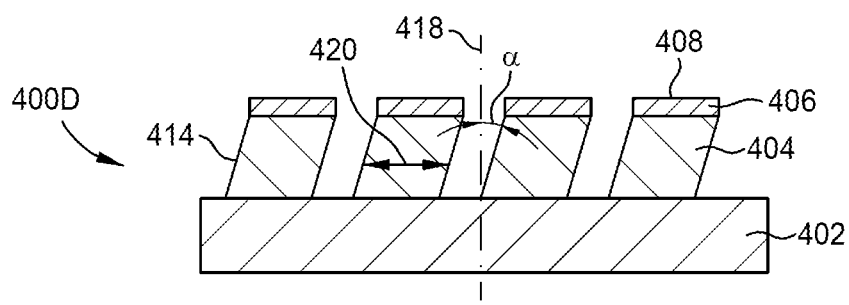
Figure 4E:
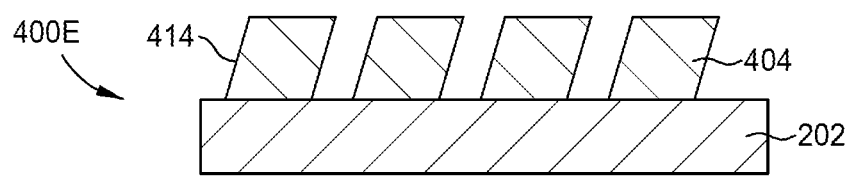

At operation 302 of the method 300, a target stack 404 is formed on a substrate 402, as shown in structure 400A in FIG. 4A. The substrate 402 is transparent and can be formed from a polymer, glass, ceramic, or other optically transparent materials. The target stack 404 is formed via chemical vapor deposition (CVD) to a thickness from 100 nm to 500 nm. In alternate embodiments, PVD, spinning-on, or ALD can be used to form the target stack 404. At operation 304, a hardmask 406 is formed via NIL on the target stack 404, as shown in structure 400B in FIG. 4B. The hardmask 406 is formed as a layer of features 408 and gaps 410 in between adjacent features 408. A bottom 412 of each gap 410 has the hardmask 406 formed thereon. The hardmask 406 can be fabricated from a metal or metal oxide or metal nitride, including TiN or TaN, or carbon, or from another etch-resistant nano-imprintable material. At operation 306, as shown in structure 400C in FIG. 4C, the bottom 412 layer of hardmask 406 in each gap 410 is removed via etching to expose the target stack 404. At operation 308, shown in structure 400D in FIG. 4D the target stack 404 is etched to form a plurality of angled mesas 414. The plurality of angled mesas 414 can be formed at an angle α from the normal plane 418 of the substrate 402. The angle α can be from 20 degrees to 70 degrees. While each of the plurality of angled mesas 414 is shown in FIG. 4D with a similar width 420, in other examples, the widths or other dimensions among and between the angled mesas 414, including the angle α, can vary. The angled mesas 414 can be formed by directionally etching using tooling configured to direct etchants at an angle relative to the target stack 404. At operation 310, the hardmask 406 is removed, as shown in structure 400E in FIG. 4E. The method 300 can be used when it may be desirable to form the hardmask 406 in operation 304, in contrast to methods discussed herein where a hardmask is deposited in a first operation and then patterned in a second operation.

Figure 5:
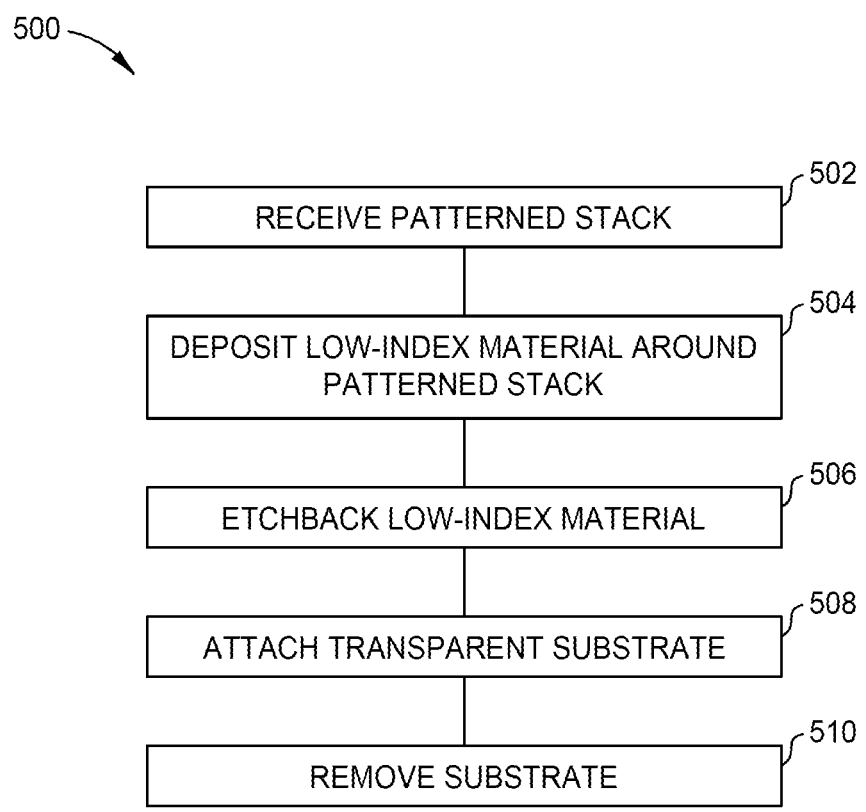
FIG. 5 is a method of transferring a grating structure from a first substrate to a second substrate according to embodiments of the present disclosure.

FIG. 5 is a method 500 of transferring a grating structure from a first substrate to a second substrate according to embodiments of the present disclosure. FIGS. 6A-6E are partial schematic illustrations of the method 500. FIGS. 5 and 6A-6E are discussed together below.

Figure 6A:
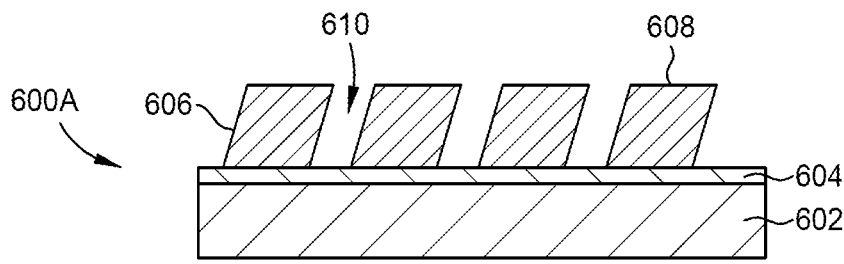
FIGS. 6A-6E are partial schematic illustrations of the formation of a grating structure according to embodiments of the present disclosure.
Figure 6B:
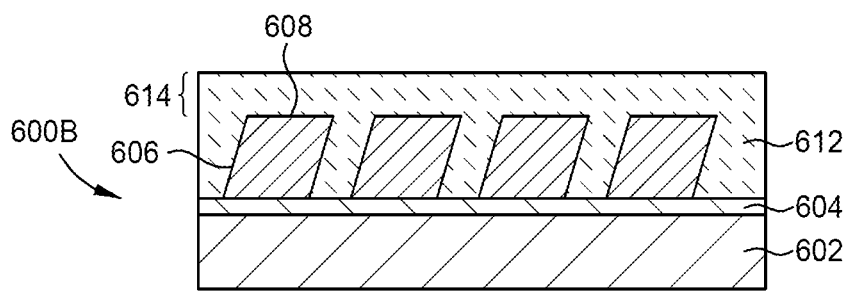
Figure 6C:
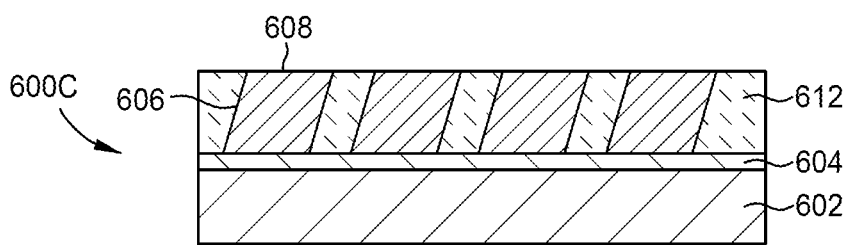
Figure 6D:
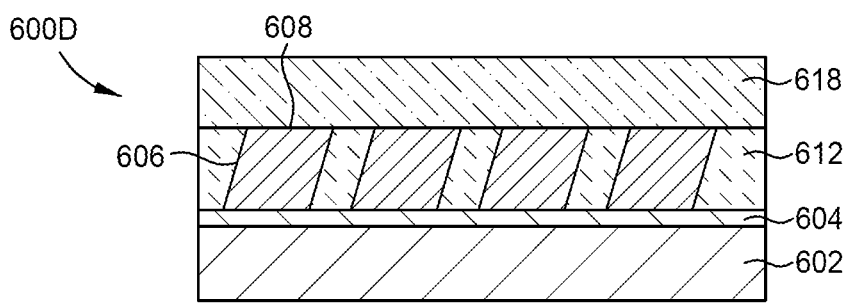
Figure 6E:
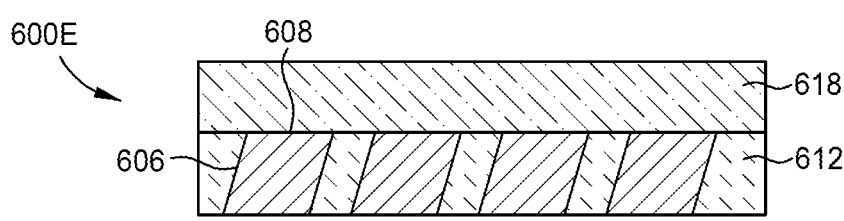

FIG. 6A illustrates a structure fabricated similarly to the structures fabricated according to the methods 100 and 300 in FIGS. 1 and 3 discussed above. However, instead of being formed on a transparent substrate as discussed above, FIG. 6A shows a structure 600A including a grating 606 formed on a first substrate 602 comprising silicon. A de-bonding layer 604 is formed by growing a thin layer of silicon dioxide with CVD, or spinning on a thin adhesive in between the first substrate 602 and the grating 606. The grating 606 includes a plurality of angled mesas 608 and a plurality of troughs 610 in between each pair of adjacent angled mesas 608. The first substrate 602 can be formed from silicon. In another example, which can be combined with other examples herein, the grating 606 can be formed from a high-index material, and the de-bonding layer 604 can be formed from a thermally-responsive adhesive or layer of $SiO_2$. At operation 502 of the method 500, the structure of FIG. 6A is received in a process chamber. At operation 504, a fill layer 612 is deposited in the troughs 610 and over the angled mesas 608 of the grating 606, as shown in structure 600B FIG. 6B. In some examples, during operation 504, the fill layer 612 forms a layer 614 on top of the angled mesas 608. This layer 614 of low-index material is removed at operation 506, as shown in structure 600C in FIG. 6C, via mechanical means, chemical means, or a combination of thereof. At operation 508, shown in structure 600D in FIG. 6D, the structure 600D is bonded to a glass substrate 618 on a side opposite of where the first substrate 602 was bonded. At operation 510, shown in structure 600E in FIG. 6E, the first substrate 602 is removed via thermal means, such that the de-bonding layer 604 releases from the grating 606, or by grinding an polishing away the silicon wafer to stop on the $SiO_2$.

Figure 7:
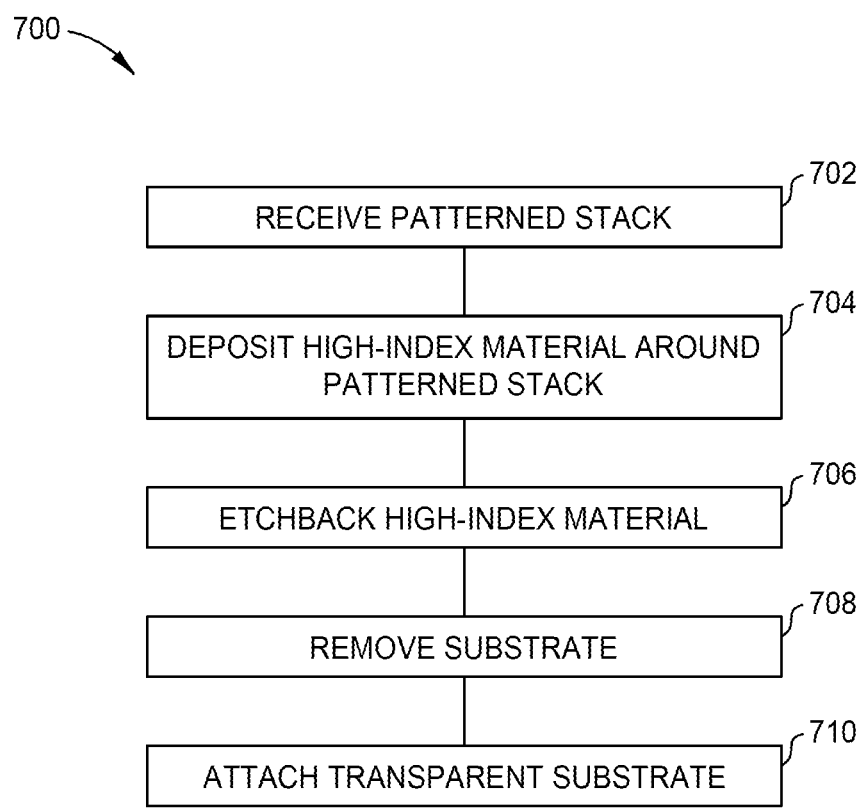
FIG. 7 is a method of transferring a grating structure from a first substrate to a second substrate according to embodiments of the present disclosure.

FIG. 7 is a method 700 of transferring a grating structure from a first substrate to a second substrate according to embodiments of the present disclosure. FIGS. 8A-8E are partial schematic illustrations of the method 700. FIGS. 7 and 8A-8E are referenced together below.

Figure 8A:
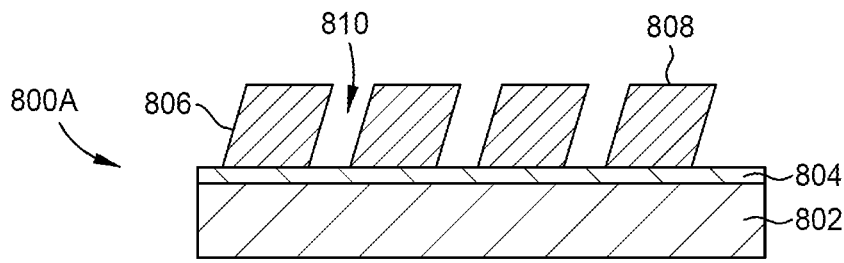
FIGS. 8A-8E are partial schematic illustrations of the formation of a grating structure according to embodiments of the present disclosure.
Figure 8B:
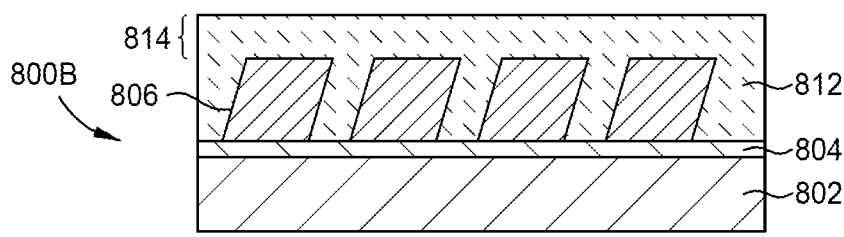
Figure 8C:
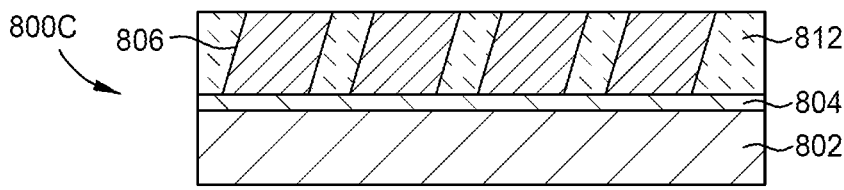
Figure 8D:
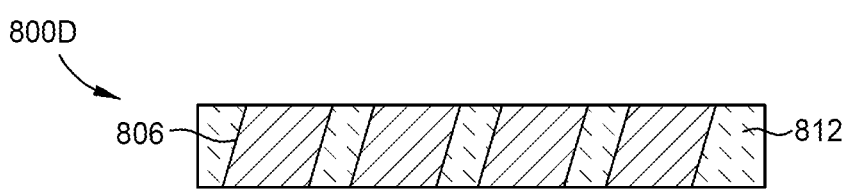
Figure 8E:
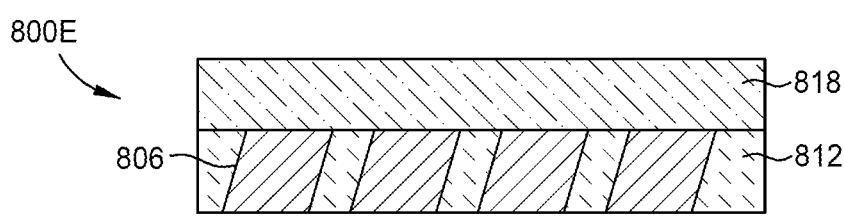

FIG. 8A illustrates a structure 800A fabricated similarly to the structures fabricated according to the methods 100 and 300 in FIGS. 1 and 3 discussed above. However, instead of being formed on a transparent substrate as discussed above, FIG. 8A shows a grating 806 formed on a first substrate 802. In one example, the first substrate 802 is formed from silicon. A de-bonding layer 804 is formed in between the first substrate 802 and the grating 806. The grating 806 comprises a plurality of angled mesas 808 and a plurality of troughs 810 in between the angled mesas 808. In one example, the first substrate 802 can be formed from silicon. In another example, that can be combined with other examples herein, the grating 806 can be formed from a low-index material. The de-bonding layer 804 can be formed from a thermally-responsive adhesive. At operation 702 of the method 700, the structure of FIG. 8A is received in a process chamber. At operation 704, a fill layer 812 is deposited in the troughs 810 and over the angled mesas 608 of the grating 806, as shown in structure 800B in FIG. 8B. In some examples, during operation 704, the fill layer 812 includes a layer 814 on top of the angled mesas 808. This layer 814 of high-index material is removed at operation 706, as shown in structure 800C in FIG. 8C, via mechanical means, chemical means, or a combination of thereof. At operation 708, shown in structure 800D in FIG. 8D, the first substrate 802 is removed via thermal means, such that the de-bonding layer 804 releases from the grating 806. At operation 710, shown in structure 800E in FIG. 8E, the structure 800D of FIG. 8D is bonded to a glass substrate 818 on a side opposite of where the first substrate 802 was bonded.

Figure 9:
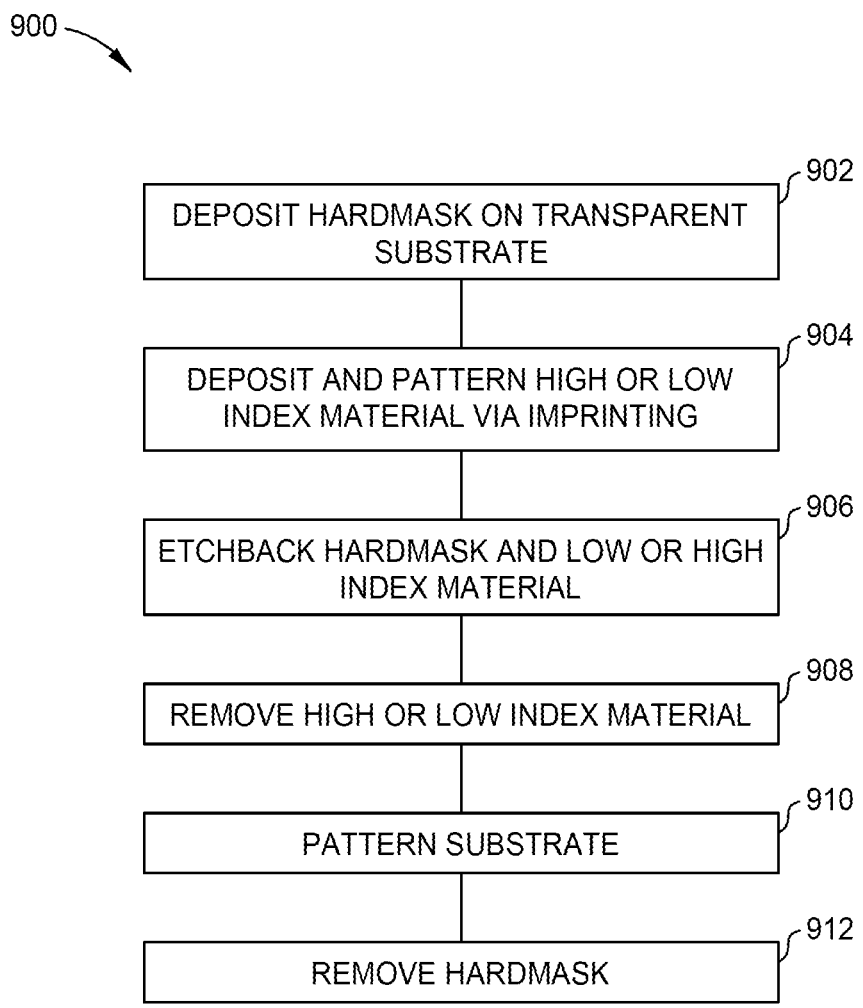
FIG. 9 is a method of directly etching a grating structure in a transparent substrate according to embodiments of the present disclosure.

FIG. 9 is a method 900 of directly etching a grating structure in a transparent substrate. FIGS. 10A-10F are partial schematic illustrations of the method 900. FIGS. 9 and 10A-10F are referenced together below.

Figure 10A:
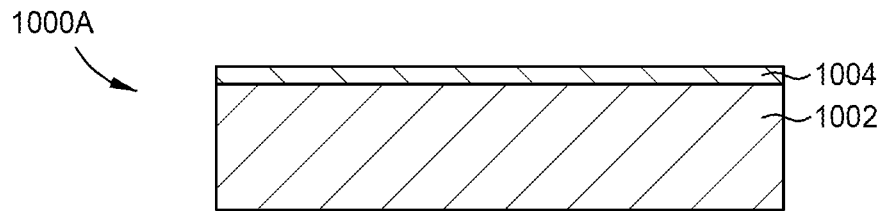
FIGS. 10A-10F are partial schematic illustrations of the formation of a grating structure according to embodiments of the present disclosure.
Figure 10B:
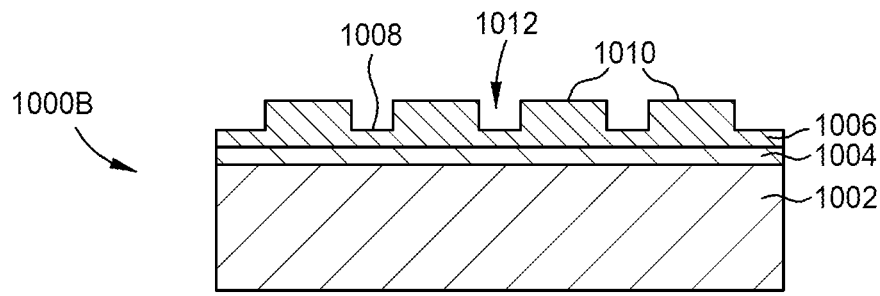
Figure 10C:
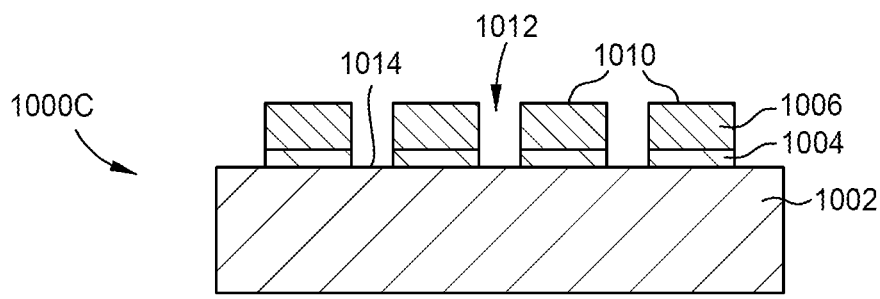
Figure 10D:
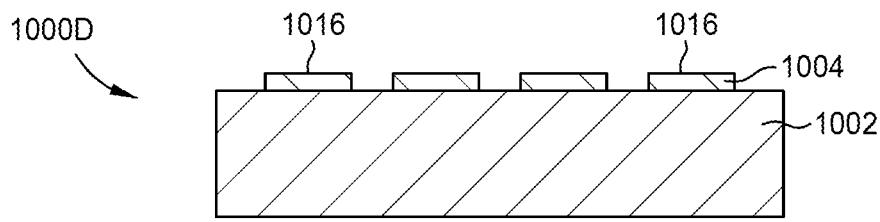
Figure 10E:
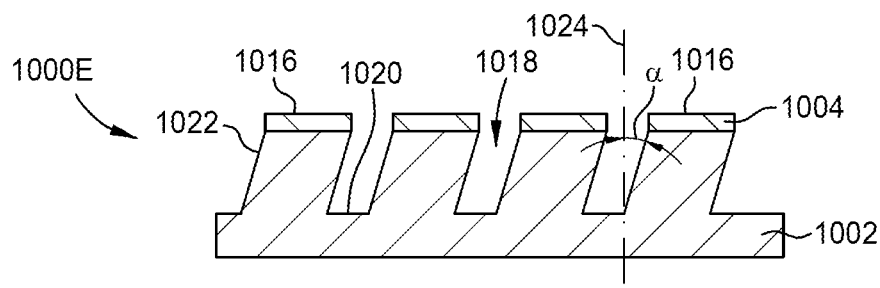
Figure 10F:
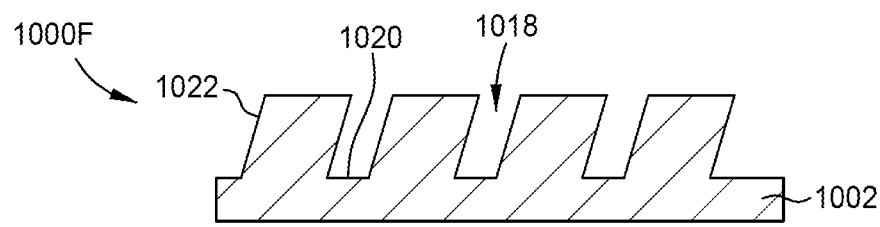

In method 900, at operation 902, as shown in structure 1000A in FIG. 10A, a hardmask 1004 is formed on a transparent substrate 1002. The transparent substrate 1002 can be formed from glass, polymer, or other materials that are optically transparent. The hardmask 1004 can be formed of TiN, TaN, Cr, or other etch resistant materials, and is formed at operation 902 via CVD, PVD, ALD, or other methods to a thickness from 10 nm to 50 nm. At operation 904, as shown in structure 1000B in FIG. 10B, a pattern is formed by NIL to create layer 1006. The layer 1006 is formed as a plurality of mesas 1010 and troughs 1012. A bottom 1008 of each trough 1012 is formed from a residual layer of the material of the layer 1006. The layer 1006 can be a low-index material or a high-index material, depending upon the embodiment. The layer 1006 is etched, along with the hardmask 1004, at operation 906 to form structure 1000C shown in FIG. 10C. Etching the layer 1006 and the hardmask 1004 at operation 906 exposes the transparent substrate 1002 at the bottom 1014 of the troughs 1012. At operation 908, shown in structure 1000D in FIG. 10D, the layer 1006 is removed, leaving a plurality of hardmask islands 1016. At operation 910, shown in structure 1000E in FIG. 10E, the transparent substrate 1002 is etched to form a plurality of angled mesas 1022 with a plurality of troughs 1018 formed in between each adjacent pair of angled mesas 1022. Each angled mesa 1022 of the plurality of angled mesas 1022 is at an angle α from a normal plane 1024. A bottom 1020 of each trough 1018 is the substrate material. At operation 912, shown in FIG. 10F, the hardmask 1004 is removed, removing the hardmask islands 1016, leaving behind the structure 1000F of the transparent substrate 1002.

Figure 11A:
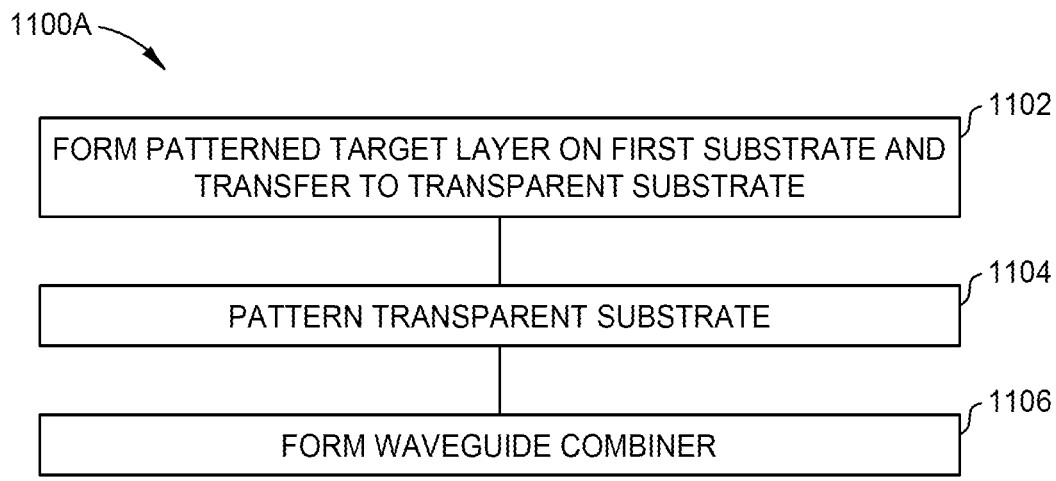
FIGS. 11A-11C are flow charts of methods used to fabricate a waveguide combiner according to embodiments of the present disclosure.
Figure 11B:
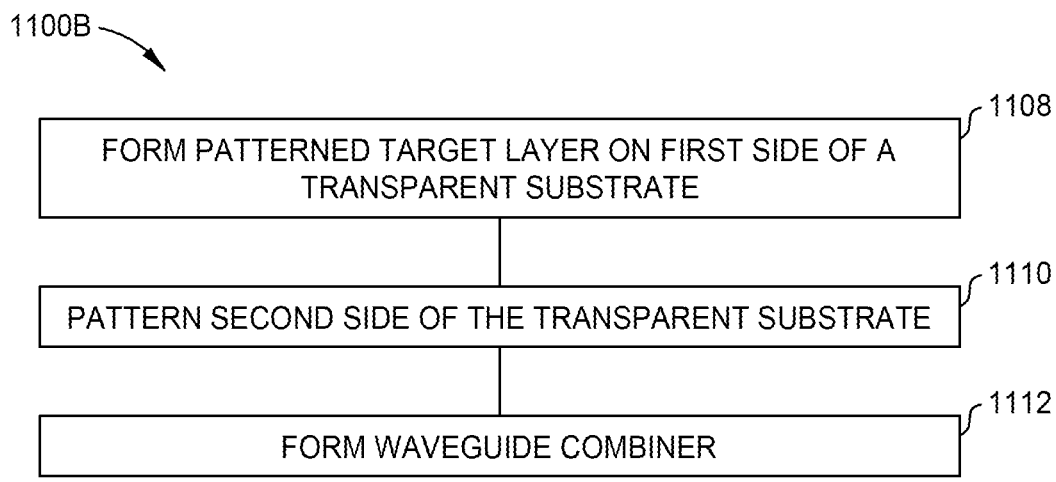
Figure 11C:
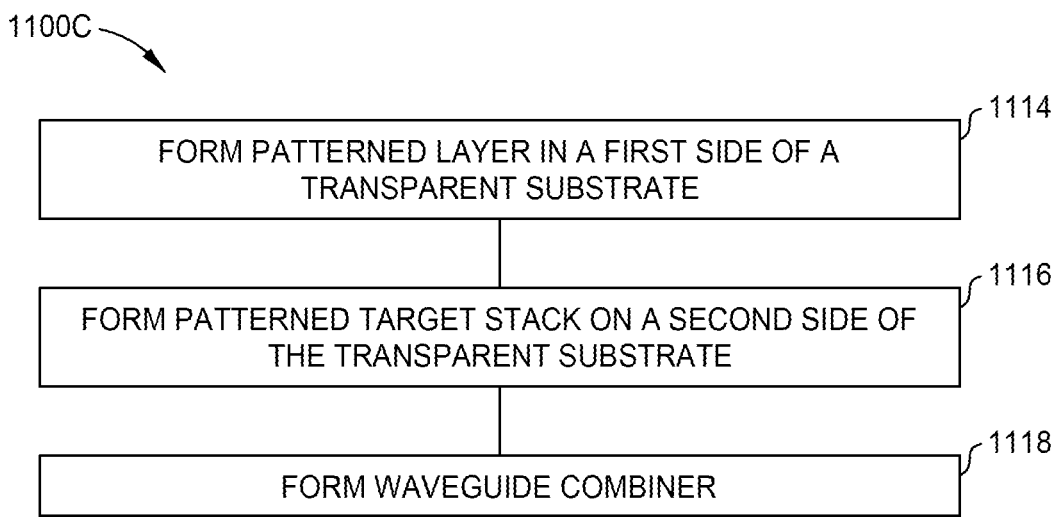

FIGS. 11A-11C are flow charts of methods used to fabricate a waveguide combiner according to embodiments of the present disclosure.

FIG. 11A shows a method 1100A of forming a diffraction grating, which can be used in a waveguide combiner, according to embodiments of the present disclosure. At operation 1102, a patterned target layer is formed on a de-bonding layer attached to a first substrate that can be formed from silicon (Si). The operation 1102 can include some or the elements of the methods 500 or 700 in FIG. 5 or 7, respectively, each of which forms a pattern on a Si substrate, de-bonds the substrate, and attaches a transparent substrate of glass, plastic, or another optically transparent material. The operation 1102 includes the transferring of the patterned target layer, which can be formed from a combination of a high index layer and a low index layer, depending upon the embodiment. In one example, the operation 1102 includes transferring the patterned target layer to a first side of a transparent substrate. At operation 1104, a second side of the transparent substrate is patterned, for example, according to the method 900 in FIG. 9, to form the waveguide combiner at operation 1106.

FIG. 11B shows a method 1100B of forming one or more diffraction gratings, which can be used in a waveguide combiner, according to embodiments of the present disclosure. At operation 1108, a patterned target layer is formed a transparent substrate, similar to what is described in the methods 100 and 300 in FIGS. 1 and 3. At operation 1110, the second side of the transparent substrate is patterned, for example, according to the method 900 in FIG. 9, to form the waveguide combiner at operation 1112.

FIG. 11C shows a method 1100C of forming one or more diffraction gratings, which can be used in a waveguide combiner, according to embodiments of the present disclosure. At operation 1114, a patterned layer is formed in a first side of a transparent substrate that can be formed from glass or polymer, operation 1114 can be executed according to the method 900 in FIG. 9. At operation 1116, a patterned target layer is formed on a second side of the transparent substrate according to a method 100 or 300 as shown in FIGS. 1 and 3 to form the waveguide combiner at operation 1118.

Figure 12:
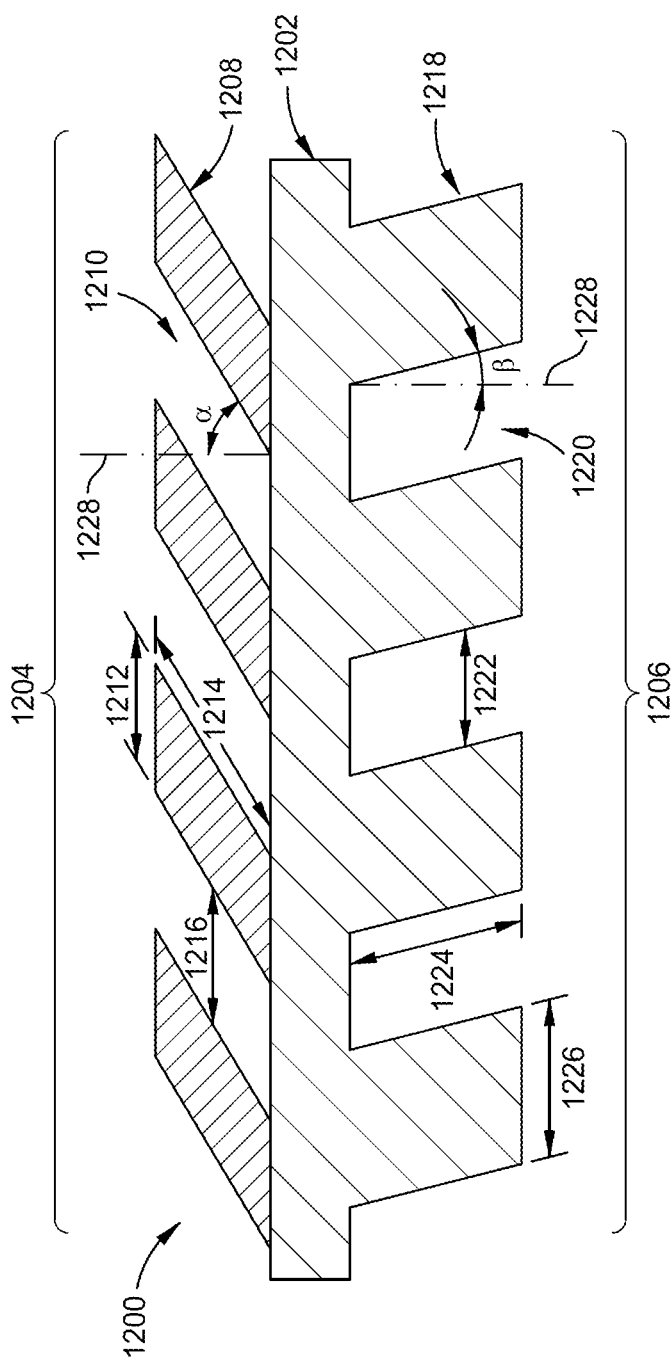
FIG. 12 is a partial schematic illustration of a waveguide combiner structure fabricated according to embodiments of the present disclosure.

FIG. 12 is a partial schematic illustration of a waveguide combiner structure 1200 fabricated through the methods of FIGS. 11A-11C. FIG. 12 shows the waveguide combiner structure 1200 comprising a transparent substrate 1202, and a first grate structure 1204 formed according to embodiments of the present disclosure, including the methods 100, 300, 500, and 700 in FIGS. 1, 3, 5, and 7, respectively. The first grate structure 1204 is shown in the example in FIG. 12 as comprising the angled mesas 1208, each of which is formed at an angle of a with respect to a normal plane 1228. The angle α can be from 20 degrees to 70 degrees. Each angled mesa 1208 can be formed from low-index material or high-index material, depending upon the embodiment. While a plurality of troughs 1210 are shown in FIG. 12 in between each pair of adjacent angled mesas 1208 as not comprising a material, in alternate embodiments, the troughs 1210 are filled with a low-index or a high-index material. If the angled mesas 1208 are formed from a low-index material, the troughs 1210 can be filled with a high-index material, and, if the angled mesas 1208 are formed from a high-index material, the troughs 1210 can be filled with a low-index material. Each angled mesa 1208 has a width 1212, a length 1214, and a spacing 1216 between adjacent angled mesas 1218. Each of the width 1212, the length 1214, and the spacing 1216 is shown in the example waveguide combiner structure 1200 as being substantially the same, as are the angles α. However, in other examples, one or more of these dimensions may vary among and between individual angled mesas 1208 or among and between groups, such as rows, columns, or combinations thereof.

The waveguide combiner structure 1200 further includes a second gate structure 1206 comprising a plurality of angled mesas 1218, formed in the transparent substrate 1202. A plurality of troughs 1220 are formed in between each adjacent pair of angled mesas 1218, and the angled mesas 1218 are formed at an angle of β with respect to the normal plane 1228. The angle β can be less than or equal to about 45 degrees. Each angled mesa 1218 is formed a distance from 1222 from an adjacent angled mesa 1218, and has a width 1226 and a length 1224. The distances 1222 in between angled mesas 1218 as well as the width 1226 and the length 1224 are shown as being substantially the same among and between angled mesas 1218. However, in alternate embodiments, one or more of these dimensions may vary among and between individual angled mesas 1218 or among and between groups, such as rows, columns, or combinations thereof.

Accordingly, using the systems and methods for waveguides and waveguide combiners discussed herein, waveguides and waveguide combiners that have a wide range of duty cycles (DC) (i.e. the radio of the mesa width to the mesa pitch) are fabricated. In one example, the challenge of shrinkage of the imprinted materials is overcome by imprinting a low index & low duty cycle grating. The imprinted structures are then filled with a high index material to form a grating with a high duty cycle and a high index grating. The examples of diffracting grating formation discussed herein can be combined with other examples herein to form diffraction gratings included in waveguides and waveguide combiners.

Although various embodiments which incorporate the teachings of the present invention have been shown and described in detail herein, those skilled in the art can readily devise many other varied embodiments that still incorporate these teachings.

What is claimed is:

1. A method of patterning a substrate, comprising:
   forming a hardmask layer on a first side of a substrate, wherein the substrate is formed from a transparent material and is defined by a normal plane along a width of the substrate;
   forming, on the hardmask layer, a patterned layer;
   etching the patterned layer and the hardmask layer to expose the first side of the substrate;
   removing the patterned layer;
   etching the first side of the substrate to form a first plurality of angled mesas in the first side of the substrate, wherein each angled mesa of the first plurality of angled mesas is etched at an angle from 20 degrees to 70 degrees relative to the normal plane;
   subsequently, removing the hardmask layer; and
   forming a second plurality of angled mesas on a second side of the substrate, the second plurality of angled mesas being at a different angle than the first plurality of angled mesas.

2. The method of claim 1, wherein forming the hardmask layer on the first side of the substrate comprises using chemical vapor deposition (CVD), physical vapor deposition (PVD), or atomic layer deposition (ALD).

3. The method of claim 1, wherein the transparent material comprises a glass or a polymer.

4. The method of claim 1, wherein forming the patterned layer comprises using nanoimprint.

5. The method of claim 1, wherein nanoimprint lithography is used in the forming of the second plurality of angled mesas on the second side of the substrate.

6. A method of forming a diffraction grating, comprising:
   forming a first hardmask layer on a target stack, wherein the target stack is formed on a first side of a first substrate;
   etching a plurality of openings in the first hardmask layer;
   etching the target stack to form a first plurality of angled mesas in the target stack on the first side of the first substrate, wherein each angled mesa of the first plurality of angled mesas is etched at a first angle from 20 degrees to 70 degrees relative to a normal plane;
   removing the first substrate from the etched target stack;
   attaching the etched target stack to a first side of a second substrate;
   forming a second hardmask layer on a second side of a second substrate, wherein the second substrate comprises a transparent material and is defined by a normal plane along a width of the second substrate;
   forming a patterned layer on the second hardmask layer;
   etching the patterned layer and the second hardmask layer to expose the second side of the second substrate;
   removing the patterned layer;
   etching the second side of the second substrate; and
   forming, in response to the etching, a second plurality of angled mesas in the second side of the second substrate, wherein each angled mesa of the second plurality of angled mesas is etched at a second angle from 20 degrees to 70 degrees relative to the normal plane.

7. The method of claim 6, wherein forming the first hardmask layer comprises using nanoimprint lithography (NIL) to deposit the first hardmask layer as a pattern, wherein the pattern comprises a third plurality of mesas and a plurality of angled troughs in between adjacent mesas of the third plurality of mesas.

8. The method of claim 6, wherein forming the patterned layer comprises using nanoimprint lithography.

9. The method of claim 6, wherein the second substrate is a transparent substrate.

10. The method of claim 6, wherein the target stack is bonded to the first substrate via a de-bonding layer, wherein removing the first substrate comprises detaching the first substrate from the target stack via the de-bonding layer.

11. The method of claim 10, wherein forming the patterned layer comprises using nanoimprint lithograph.

12. The method of claim 6, further comprising etching each of the target stack and the second side of the second substrate using directional etching.

13. The method of claim 12, wherein directional etching comprises:

positioning a first portion of the target stack in a path of an ion beam, the ion beam being at the first angle relative to the normal plane of the first substrate, wherein etching the first portion of the target stack comprises exposing the first portion of the target stack to the ion beam to form the first plurality of angled mesas at the first angle; and rotating the first substrate about a central axis perpendicular to the normal plane to a predetermined rotation angle.

14. The method of claim 13, further comprising positioning a second portion of the target stack in the path of the ion beam after rotating the first substrate to the predetermined rotation angle; and etching the second portion of the target stack to form a third plurality of mesas by exposing the second portion of the target stack to the ion beam.

15. A method of forming diffraction gratings, comprising:

forming a hardmask layer on a target stack, wherein the target stack is formed on a first side of a first substrate;

etching a plurality of openings in the hardmask layer;

etching the target stack to form a first plurality of angled mesas in the target stack on the first side of the first substrate, wherein each angled mesa of the plurality of angled mesas is etched at an angle 20 degrees to 70 degrees relative to a normal plane;

forming a hardmask layer on a second side of the first substrate, wherein the first substrate is defined by a normal plane along a width of the first substrate;

forming a patterned layer on the hardmask layer;

etching the patterned layer and the hardmask layer to expose the second side of the first substrate;

removing the patterned layer; and etching the second side of the first substrate.

16. The method of claim 15, wherein forming the patterned layer comprises using nanoimprint lithography.

17. The method of claim 15, further comprising: forming, in response to the etching, a plurality of angled mesas in the second side of the first substrate.

18. The method of claim 17, wherein each angled mesa of the plurality of angled mesas is etched at an angle from 20 degrees to 70 degrees relative to the normal plane.

19. The method of claim 18, wherein forming the hardmask layer on the first substrate comprises using chemical vapor deposition (CVD), physical vapor deposition (PVD), or atomic layer deposition (ALD).

20. The method of claim 15, wherein the first substrate is optically transparent and comprises a glass or a polymer.

* * * * *